(12) United States Patent
Cheng (10) Patent No.: US 9,198,281 B2
(45) Date of Patent: Nov. 24, 2015

(54) LEADFRAME FOR SEMICONDUCTOR PACKAGES

(71) Applicant: MediaTek Inc., Hsin-Chu (TW)

(72) Inventor: Tao Cheng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/100,444

(22) Filed: Dec. 9, 2013

(65) Prior Publication Data

US 2014/0097012 A1    Apr. 10, 2014

Related U.S. Application Data

(63) Continuation of application No. 12/758,141, filed on Apr. 12, 2010, now abandoned, which is a continuation of application No. 11/539,239, filed on Oct. 6, 2006, now abandoned.

(60) Provisional application No. 60/731,779, filed on Oct. 31, 2005.

(51) Int. Cl.
| | |
|---|---|
| *H05K 1/02* | (2006.01) |
| *H01L 23/495* | (2006.01) |
| *G06F 17/50* | (2006.01) |
| *H01L 23/64* | (2006.01) |
| *H01L 23/00* | (2006.01) |

(52) U.S. Cl.
CPC .............. *H05K 1/025* (2013.01); *G06F 17/5077* (2013.01); *H01L 23/49541* (2013.01); *H01L 23/64* (2013.01); *H01L 24/48* (2013.01); *H01L 24/49* (2013.01); *H01L 2224/48247* (2013.01); *H01L 2224/49171* (2013.01); *H01L 2924/19051* (2013.01); *H01L 2924/3011* (2013.01); *H01L 2924/30107* (2013.01)

(58) Field of Classification Search
CPC ............ H01L 23/495; H01L 23/49541; H01L 23/49544; H01L 23/49565; H01L 33/62
USPC ........................................ 257/666, 670, 676
See application file for complete search history.

(56) References Cited

U.S. PATENT DOCUMENTS

| | | | | |
|---|---|---|---|---|
| 3,793,474 | A | * | 2/1974 | Dunn et al. .................... 174/529 |
| 4,454,529 | A | * | 6/1984 | Philofsky et al. .............. 257/684 |
| 4,680,613 | A | * | 7/1987 | Daniels et al. ................ 257/670 |
| 4,725,692 | A | | 2/1988 | Ishii et al. |
| 5,065,224 | A | | 11/1991 | Fraser et al. |
| 5,147,815 | A | | 9/1992 | Casto |
| 5,281,849 | A | | 1/1994 | Singh Deo |

(Continued)

OTHER PUBLICATIONS

Harper, C.A.; "Electronic Packaging and Interconnect Handbook;" 1991; 1st Edition; pp. 6.1-6.3 & 6.48-6.51.

*Primary Examiner* — Peniel M Gumedzoe
(74) *Attorney, Agent, or Firm* — McClure, Qualey & Rodack, LLP (57) ABSTRACT

A leadframe for semiconductor packages is provided. The leadframe includes a die pad, a side rail, a tie bar, and a plurality of leads. The side rail is around the die pad. The tie bar connects the die pad and the side rail. The leads extend from the side rail to close proximity to the die pad. The leads includes a first lead and a second lead being at opposite locations of the leadframe relative to a center line through the die pad. The first and second leads are substantially asymmetrical with each other relative to the center line and have different impedance values. The plurality of leads are disconnected from each other.

16 Claims, 11 Drawing Sheets

(56) References Cited

U.S. PATENT DOCUMENTS

| | | |
|---|---|---|
| 5,497,030 A | 3/1996 | Takeuchi |
| 5,517,056 A | 5/1996 | Bigler et al. |
| 5,541,565 A | 7/1996 | Dowsing et al. |
| 5,608,265 A | 3/1997 | Kitano et al. |
| 5,757,067 A | 5/1998 | Inaba |
| 5,783,463 A | 7/1998 | Takehashi |
| 5,918,112 A | 6/1999 | Shah et al. |
| 5,994,768 A | 11/1999 | Fogelson |
| 6,281,568 B1 | 8/2001 | Glenn et al. |
| 6,424,541 B1 | 7/2002 | Fazelpour |
| 6,621,140 B1 | 9/2003 | Gibson |
| 7,102,208 B1 | 9/2006 | Lee et al. |
| 7,115,978 B2 * | 10/2006 | Sun et al. .............. 257/676 |
| 2002/0192873 A1 | 12/2002 | Corisis |
| 2003/0141578 A1 | 7/2003 | Corisis |
| 2005/0173783 A1 | 8/2005 | Chow et al. |

* cited by examiner

LEADFRAME FOR SEMICONDUCTOR PACKAGES

CROSS REFERENCE TO RELATED APPLICATIONS

This application is a Continuation of pending U.S. patent application Ser. No. 12/758,141, filed on Apr. 12, 2010, which is a Continuation of pending U.S. patent application Ser. No. 11/539,239, filed on Oct. 6, 2006, which claims the benefit of provisional Application No. 60/731,779, filed on Oct. 31, 2005, the entirety of which are incorporated by reference herein.

BACKGROUND OF THE INVENTION

1. Field of the Invention

The invention relates to leadframes for semiconductor packages and in particular to leadframes for high frequency applications.

2. Description of the Related Art

Semiconductor dies are enclosed in plastic packages that provide protection from hostile environments and enable electrical interconnection between the semiconductor die and a printed circuit board via a metal leadframe. The conventional leadframe type semiconductor package has a central supported die pad for supporting semiconductor die, a plurality of leads peripherally located therein, a plurality of bonding wires for electrically connecting the semiconductor die to the leads, and a mold compound, such as plastic, for encapsulating these components in a package structure.

In most semiconductor package configurations, a portion of the leadframe is internal to the package, (i.e., completely surrounded by the mold compound). Portions of the leads of the leadframe typically extend externally from the package body for electrically connecting the package to the printed circuit board.

In the electronics industry, there is continued demand for developing semiconductor dies which have increasing processing speeds and higher degrees of integration. For a semiconductor package to accommodate these enhanced semiconductor dies, the number of leads included in the semiconductor package must be significantly increased. To avoid an undesirable increase in the size of the semiconductor package attributable to the increased number of leads, a common practice is to reduce or narrow the spacing between the leads. However, a decreased spacing between the leads increases the capacitance between the leads, and increases the level of self inductance and mutual inductance. This inductance adversely affects the quality of signals transmitted on the leads of the leadframe by increasing signal reflections; causing greater impedance mismatches.

Figure 2A:
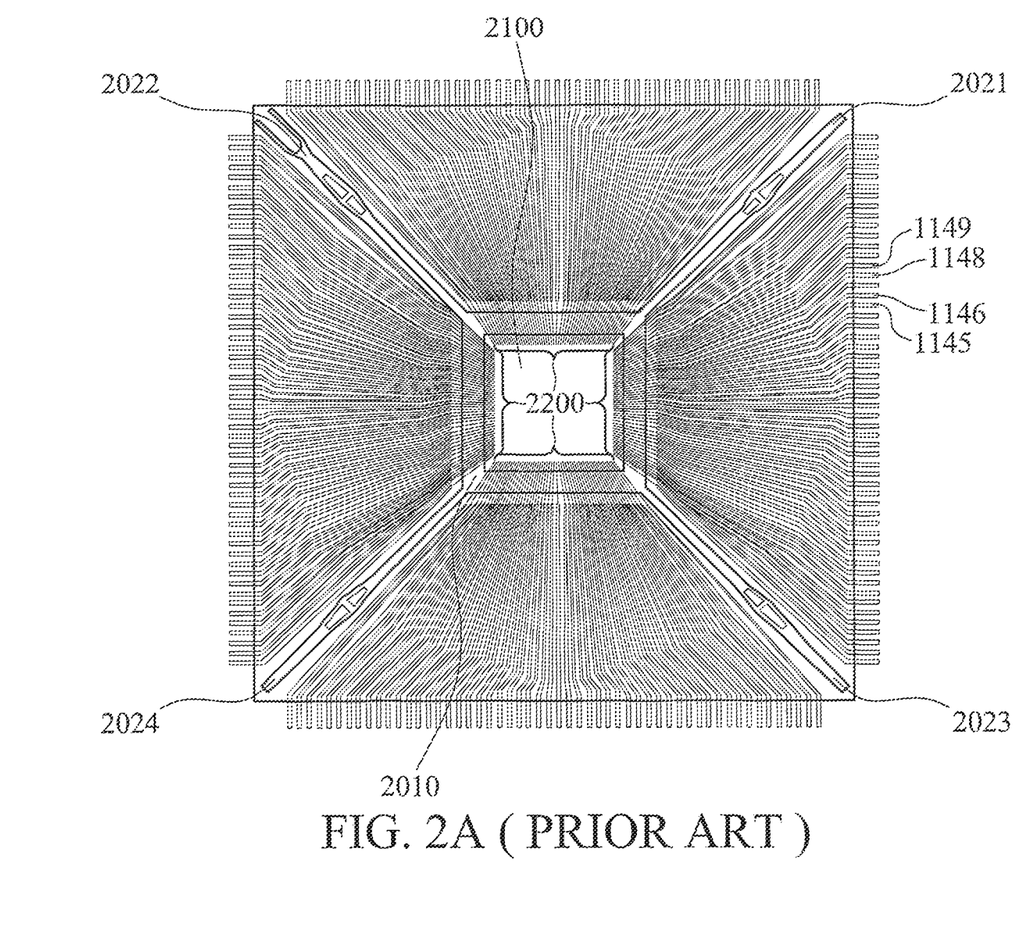
FIGS. 2A through 2B illustrate a conventional symmetrical leadframe.

Especially, in high frequency applications the semiconductor package has the greatest influence on total performance of the circuit, and one of the main causes of performance degradation is inductance of the interconnections between chip and printed circuit board. Therefore, as the operating frequency of these circuits increases, there is a need for even lower impedance mismatches packages. As shown in FIG. 2A, conventionally, the lead route or lead distribution of the leadframe is substantially symmetrical for desired producibility or manufacturability and lower process cost, but do negatively affect the impedance match.

BRIEF SUMMARY OF THE INVENTION

The invention provides leadframe for semiconductor packages and a method utilizing the same, providing flexible impedance match design, improving the electrical performance of the resulting electronic products.

The invention provides a leadframe for semiconductor packages comprising a die pad, a side rail, a tie bar, and a plurality of leads. The side rail is around the die pad. The tie bar connects the die pad and the side rail. The leads extend from the side rail to close proximity to the die pad. The lead includes a first lead and a second lead being at opposite locations of the leadframe relative to a center line through the die pad. The first and second leads are substantially asymmetrical with each other relative to the center line and have different impedance values. The plurality of leads are disconnected from each other.

The invention further provides a method of achieving a desired impedance value for a leadframe for semiconductor packages. The method includes providing a leadframe comprising a die pad, a side rail around the die pad, a tie bar connecting the die pad and the side rail, and a plurality of leads extending from the side rail in close proximity to the die pad; and designing a layout of the plurality of leads comprising a first lead and a second lead being at opposite locations of the leadframe relative to a center line through the die pad. The first and second leads are substantially asymmetrical with each other relative to the center line and have different impedance values. The plurality of leads are disconnected from each other.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1A through 1E are top views of a preferred embodiment of the invention. Referring to the FIGS. 1A through 1E, the leadframe comprises a die pad 10, a side rail 30, tie bars 21 through 24, and a plurality of leads. The side rail 30 is around the die pad 10. The tie bars 21 through 24 connect the die pad 10 and the side rail 30. The leads extend from the side rail 30 close proximity to the die pad 10. In some cases, the side rail 30 is removed in a trimming or separation step of the subsequent semiconductor packaging process.

The invention provides the capability to vary the impedance of an electrical device. As examples, impedance can be controllably varied by changing: the length of the leads; the pitch of the leads; the spacing between the leads; and/or the width of the leads. In consequence, in order to respectively adjust the impedance of the leads, the invention provides an asymmetrical leadframe structure.

In FIGS. 1A through 1E, each lead has a corresponding lead relative to a predetermined center line at opposite location of the leadframe. In this embodiment, an exemplary center line 50 is shown in FIGS. 1A through 1E. For example, the lead 241 corresponds to respective leads 141a through 141e in respective FIGS. 1A through 1E, and the lead 245 corresponds to the lead 145. In this embodiment, the leadframe comprises a pair of corresponding leads including the lead and the corresponding lead, substantially asymmetrical to each other. Specifically, this asymmetrical design serves for impedance matching. For example, the lead 241 is substantially asymmetrical with the respective leads 141a through 141e in FIGS. 1A through 1E relative to the predetermined center line 50. FIGS. 1A through 1E show various examples of asymmetrical leads for the asymmetrical leadframe structure.

Figure 1A:
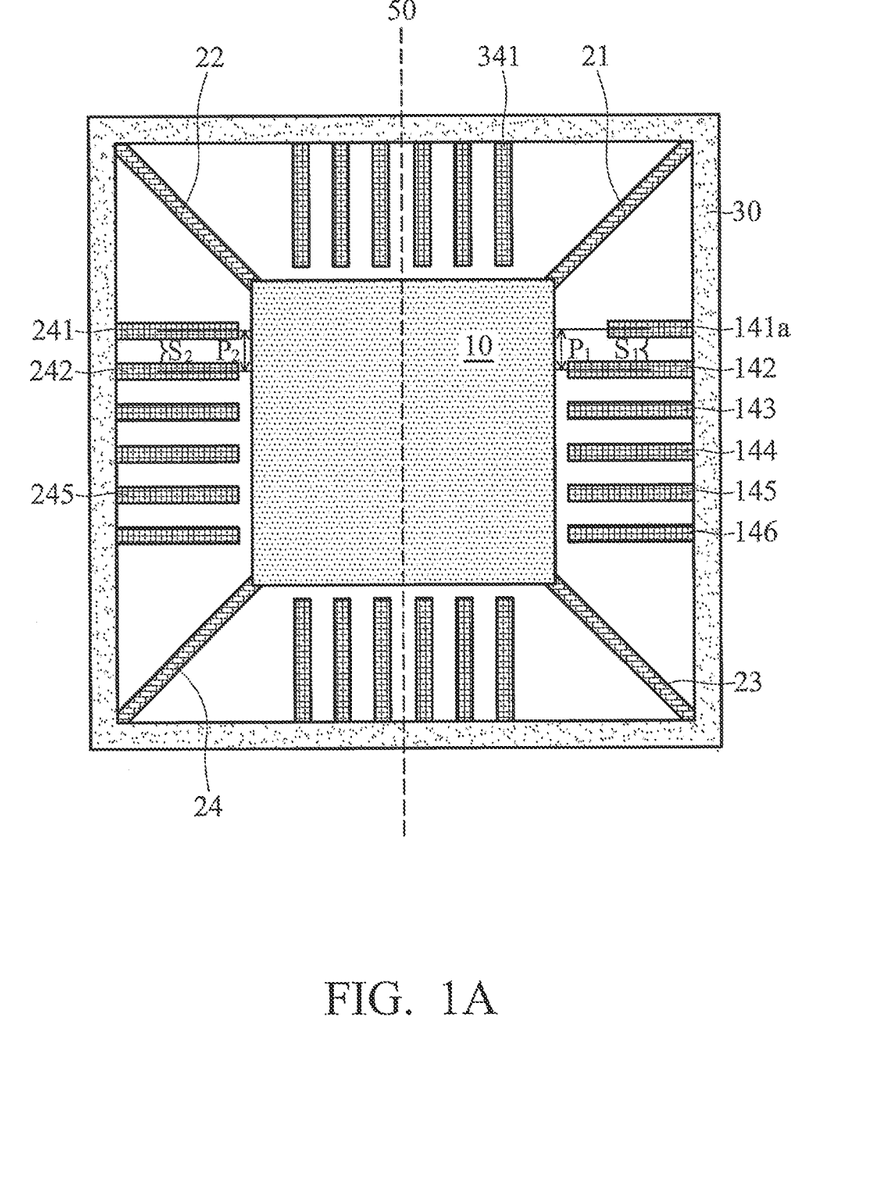
FIGS. 1A through 1E illustrate top views of a preferred embodiment of the invention.

In some cases, the corresponding lead of a specific lead depends on the selected center line, such as the center line 50 of this embodiment. In FIG. 1A, for example, the lead 141a corresponds to the lead 241 relative to line center 50. Also, the lead 141a corresponds to the lead 146 relative to a center line (not shown) passing through the space between the leads 143 and 144. Further, the lead 141a corresponds to the lead 341 relative a center line (not shown) passing through and aligned with the tie bars 21. In this embodiment, the center line 50 is utilized as the exemplary center line in subsequent discussion.

Referring to FIGS. 1A through 1E, lead 141a through 141e are asymmetrical to lead 241 relative to center line 50, either the geometry of the lead or the route of the lead. Accordingly, the pair of corresponding asymmetrical leads related to the center line means that they are not identical in shape, dimension, or the relationship of itself to other corresponding parts of the leadframe.

In FIG. 1A, the leads 141a and 241 have different lengths, and thus, are considered to be asymmetrical. In consequence, comparing the pair of corresponding lead 141a and lead 241, the varied lead length results in varied resistance of the lead 141a. Thus, a desired impedance value can be achieved by adjusting the lead length.

Figure 1B:
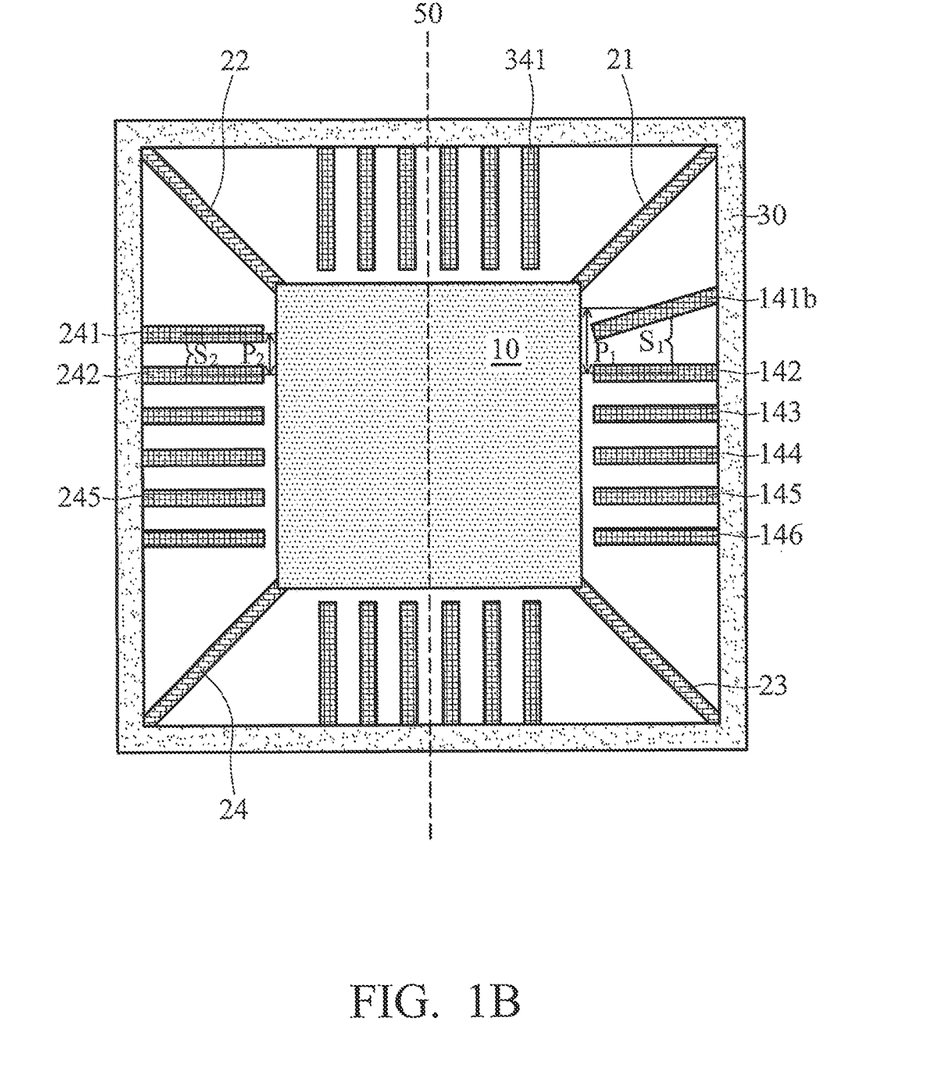

In FIG. 1B, the leads 141b and 241 have substantially the same widths. However, space $S_1$ between lead 141b and the adjacent lead, for example lead 142, is larger than space $S_2$ between lead 241 and the corresponding adjacent lead, for example lead 242. Further, the pitch $P_1$ is also larger than the pitch $P_2$. Thus, the leads 141b and 241 are considered to be asymmetrical. In consequence, comparing the pair of corresponding lead 141b and lead 241, varied space between the leads results in varied inductance between the leads. Thus, a desired impedance value can be achieved by adjusting space between the leads.

Figure 1C:
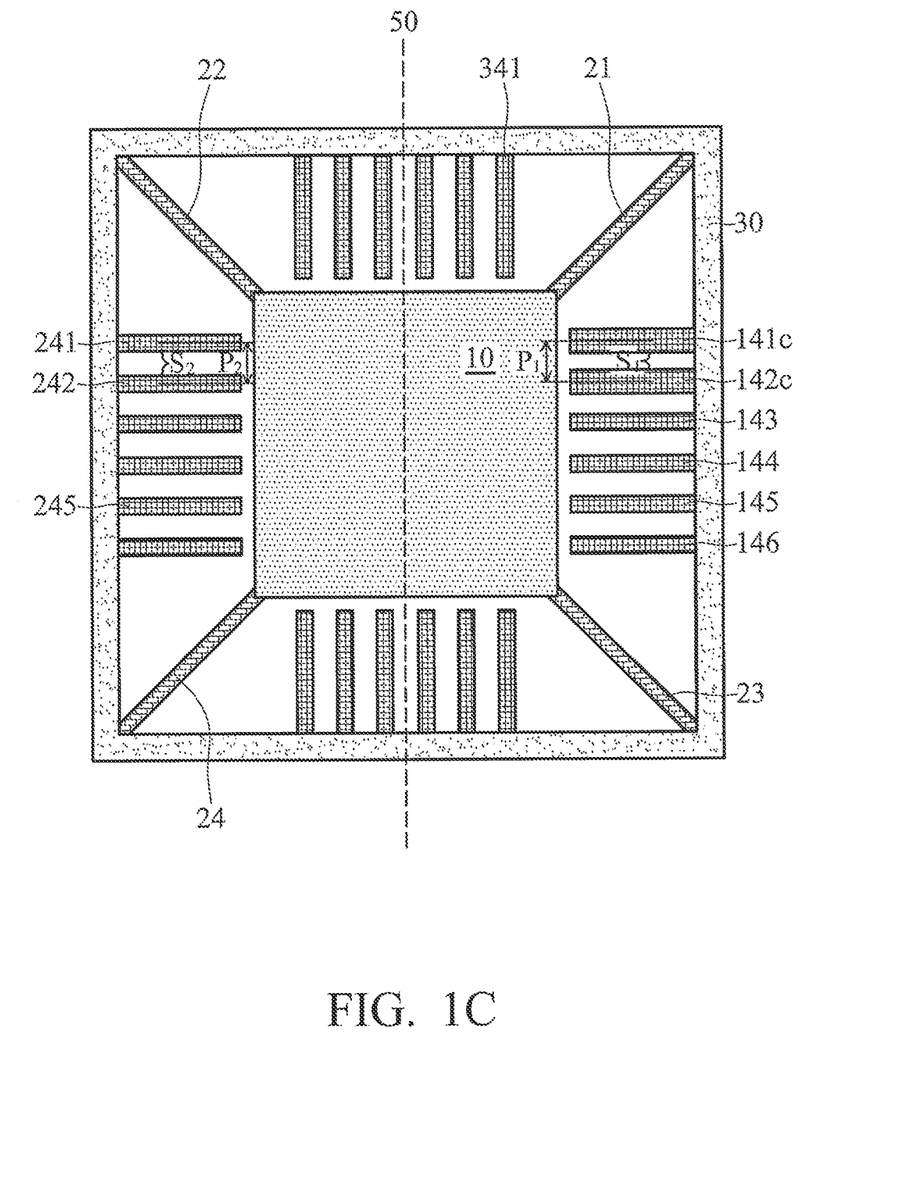

In FIG. 1C, the leads 141c and 142c respectively have different widths from the corresponding leads 241 and 242. Further, space $S_1$ between lead 141c and the adjacent lead, for example lead 142c, is less than space $S_2$ between lead 241 and the corresponding adjacent lead, for example lead 242. And thus, the leads 141c and 241 are considered to be asymmetrical, and the leads 142c and 242 are considered to be asymmetrical. In consequence, comparing the pair of corresponding lead 141c and lead 241, or lead 142c and lead 242, varied lead width results in varied resistance of the lead. Thus, a desired impedance value can be achieved by adjusting the lead width.

Figure 1D:
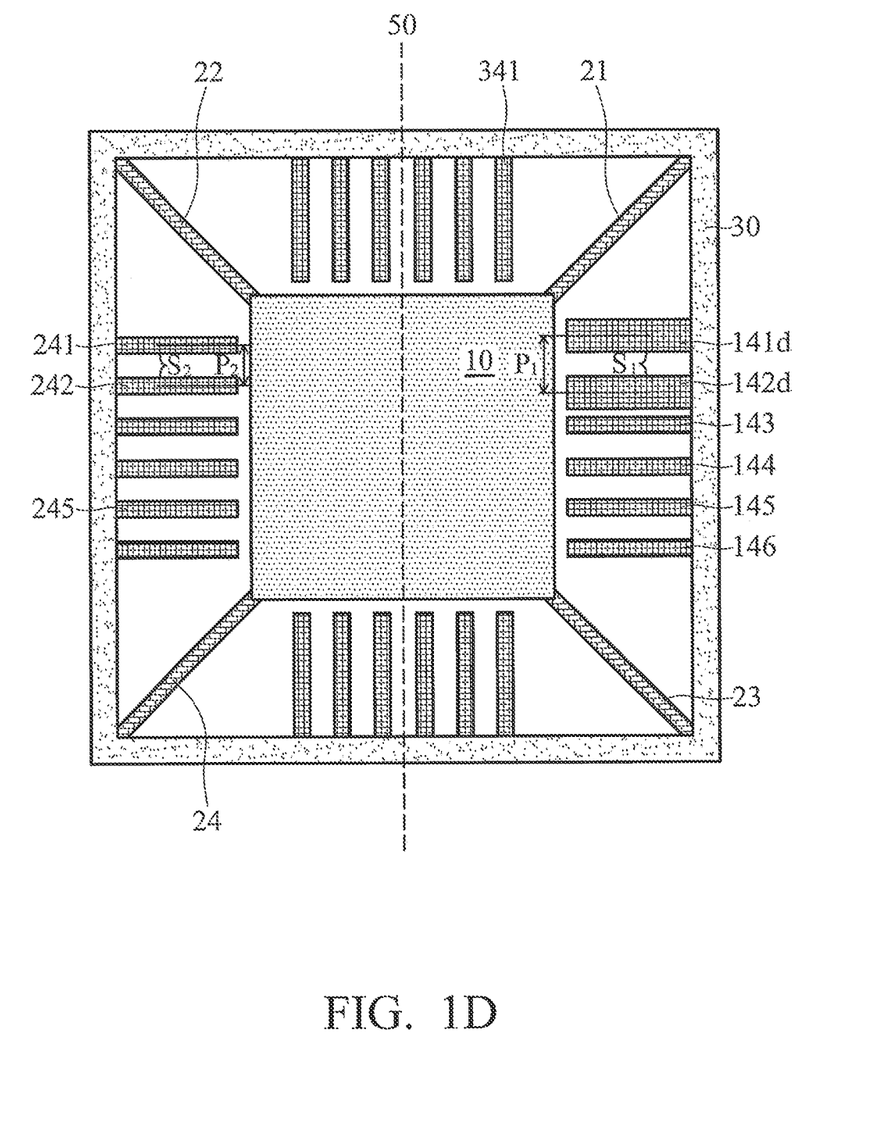

In FIG. 1D, the pitch $P_1$ between the lead 141d and the adjacent lead, such as lead 142d, is larger than the pitch $P_2$ between the lead 241 and the corresponding adjacent lead, such as lead 242. Thus, the leads 141d and 241 are considered to be asymmetrical. In consequence, comparing the pair of corresponding lead 141d and lead 241, varied lead pitch results in varied inductance between the leads. Thus, a desired impedance value can be achieved by adjusting the lead pitch.

Figure 1E:
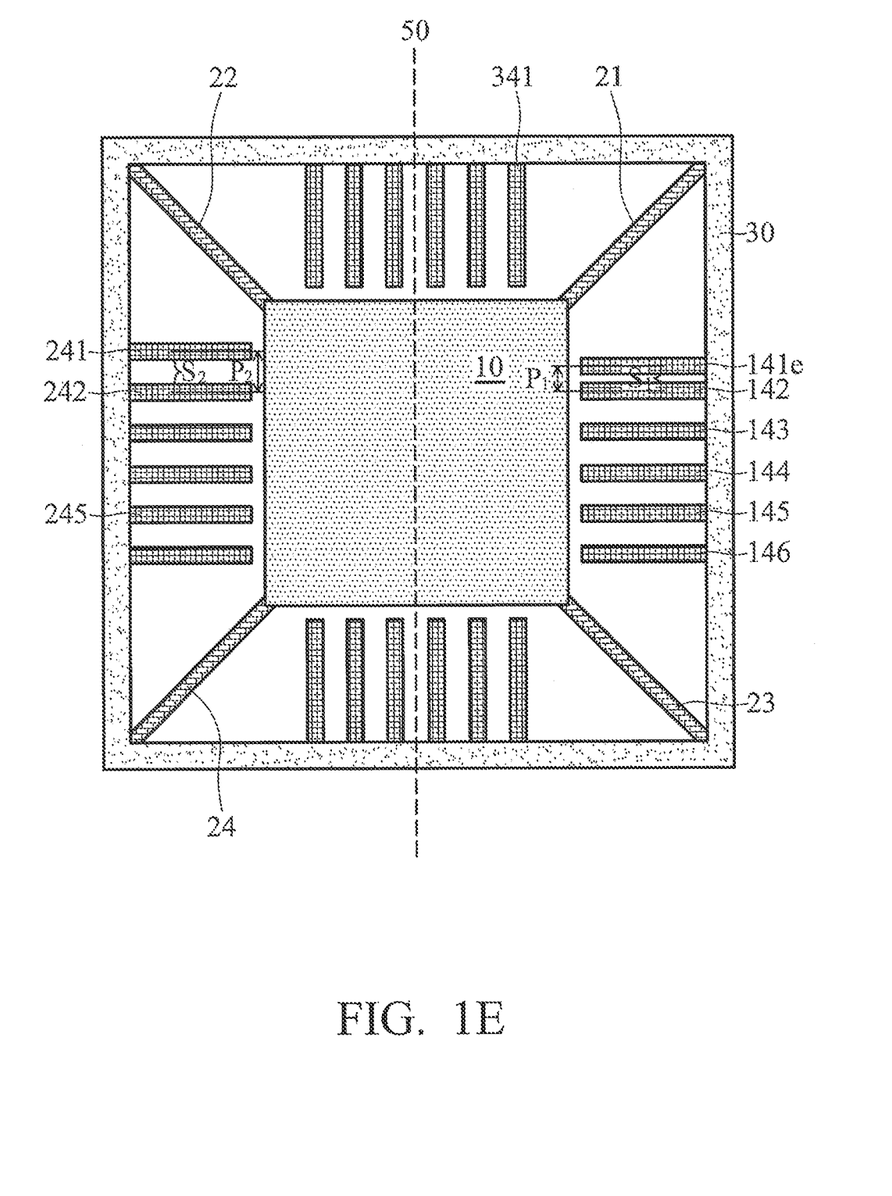

In FIG. 1E, pitch $P_1$ between the lead 141e and the adjacent lead, such as lead 142, is less than the pitch $P_2$ between the lead 241 and the corresponding adjacent lead, such as lead 242. Thus, the leads 141e and 241 are considered to be asymmetrical. In consequence, comparing the pair of corresponding lead 141e and lead 241, the varied lead pitch results in varied inductance between the leads. Thus, a desired impedance value can be achieved by adjusting the lead pitch.

Figure 2B:
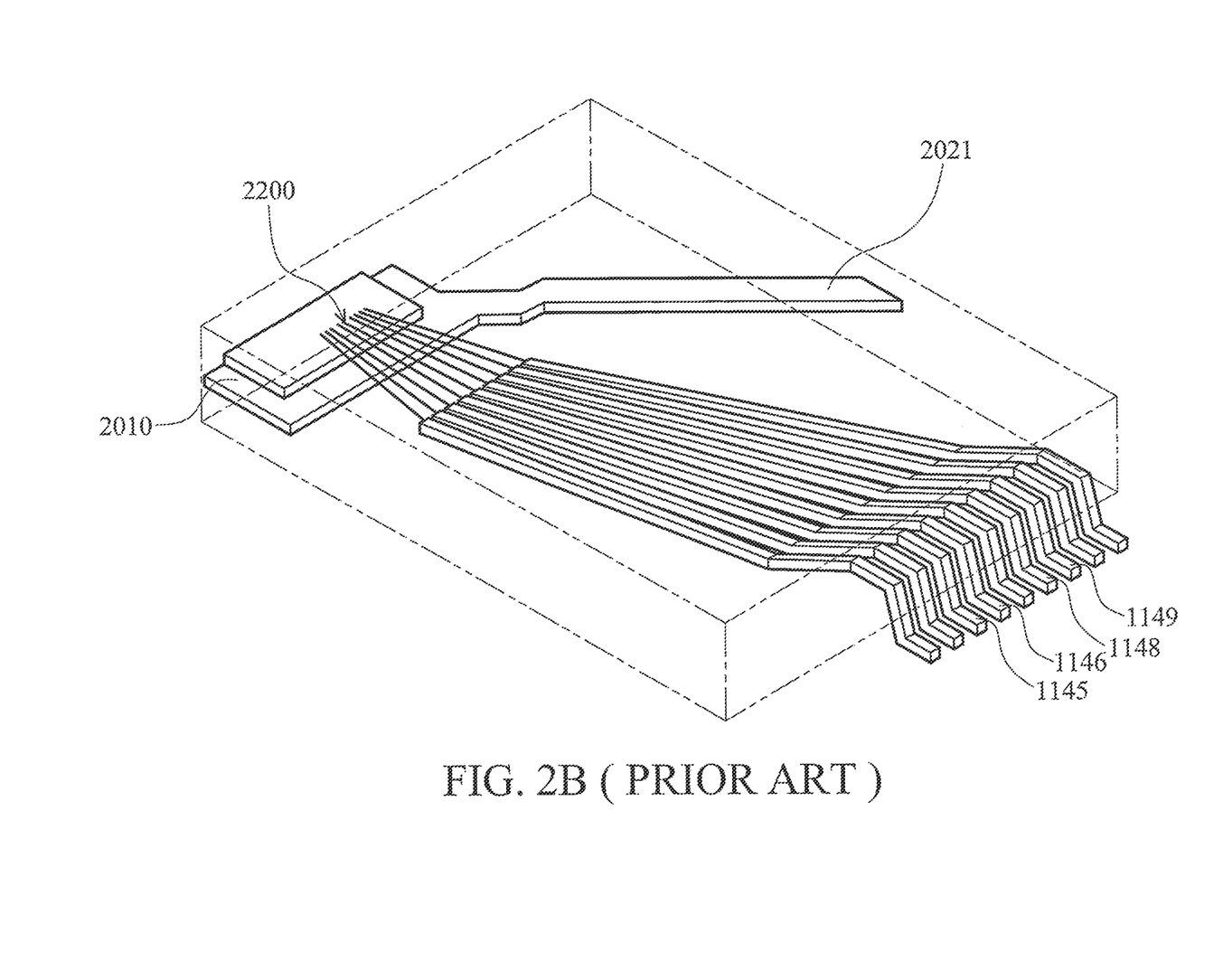

Next, a conventional symmetrical leadframe is shown in FIGS. 2A through 2B, and two experimental examples of the invention are respectively shown in FIGS. 3A, 3B and FIGS. 4A, 4B verifying the improved performance of the embodiment.

In FIG. 2A, a top view of a conventional semiconductor package is shown. The package comprises a leadframe, a semiconductor chip 2100 attached to a die pad 2010 of the leadframe, a plurality of bonding wires 2200 electrically connecting the semiconductor chip 2100 and the leads of the leadframe, and an encapsulant (not shown) encapsulating the semiconductor chip 2100, the leadframe, and the bonding wires 2200. The leadframe comprises a die pad 2010, four tie bars 2021 through 2024 for supporting die pad 2010, and a plurality of leads. The side rail was trimmed during the packaging process. The conventional leadframe which the routes of the leads are substantially symmetrical.

In FIG. 2B, a magnified drawing of the exemplary leads 1145, 1146, 1148, and 1149 in FIG. 2A is shown. For an electronic signal with a frequency of approximately 750 MHz, the differential impedance values of a differential pair of the leads 1145 and 1146 is near 68 ohm. Similarly, the differential impedance value of a differential pair of the leads 1148 and 1149 is near 68 ohm. And the single-ended impedance values of those leads 1145, 1146, 1148, and 1149 are near 50 ohm. In some case, however, the desired differential impedance values for some leads are required between 80 and 120 ohm, and preferably approximately 100 ohm. Or the desired single-ended impedance values for some leads are required between 40 and 60 ohm, and preferably approximately 50 ohm. Thus, the utilization of the conventional symmetrical leadframe cannot achieve the desired impedance value.

Figure 3A:
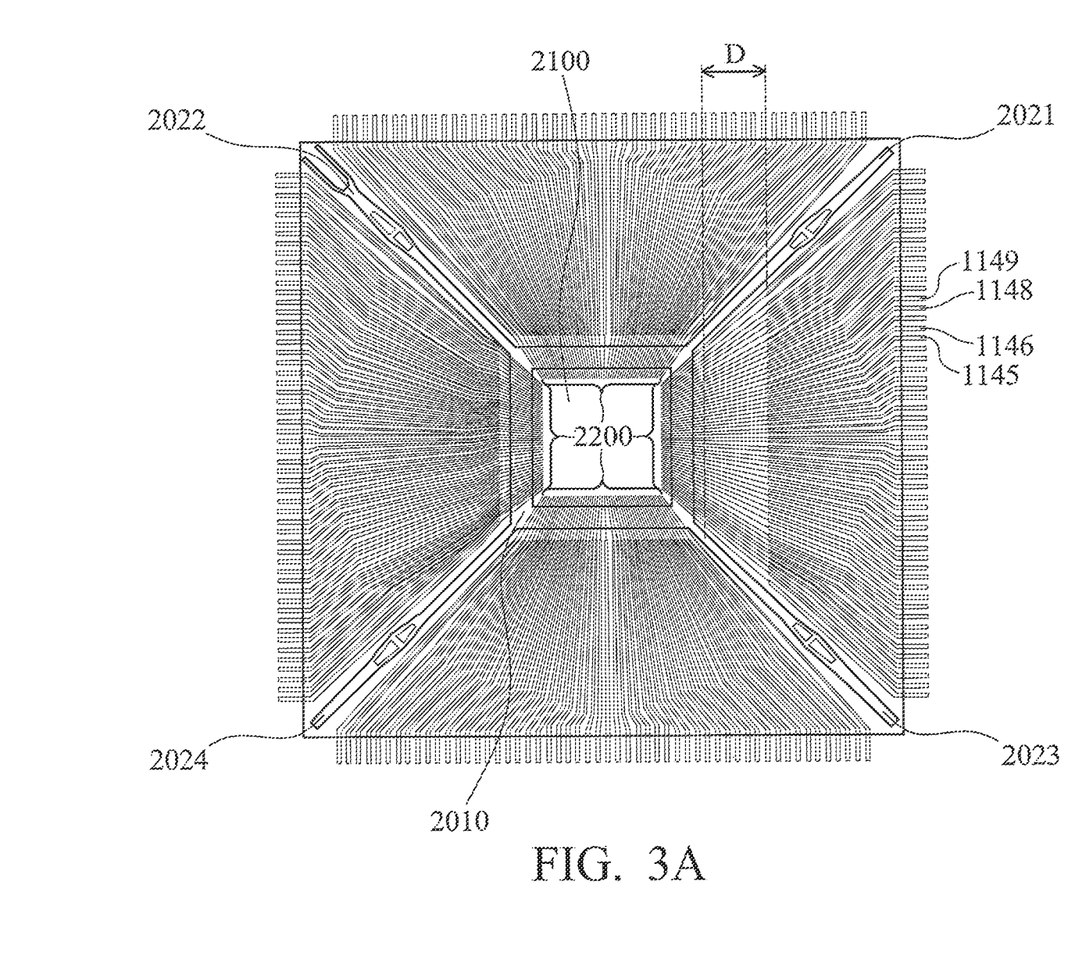
FIGS. 3A and 3B illustrate a first experimental example of the invention.

In FIG. 3A, a top view of a semiconductor package of a first experimental example of the invention is shown. Compared to that shown in FIG. 2A, the lengths of the leads 1145, 1146, 1148, and 1149 are reduced by D, which is approximately 60 mils in this embodiment. Thus, the leadframe utilized in the package shown in FIG. 3A can act as another embodiment of the invention.

Figure 3B:
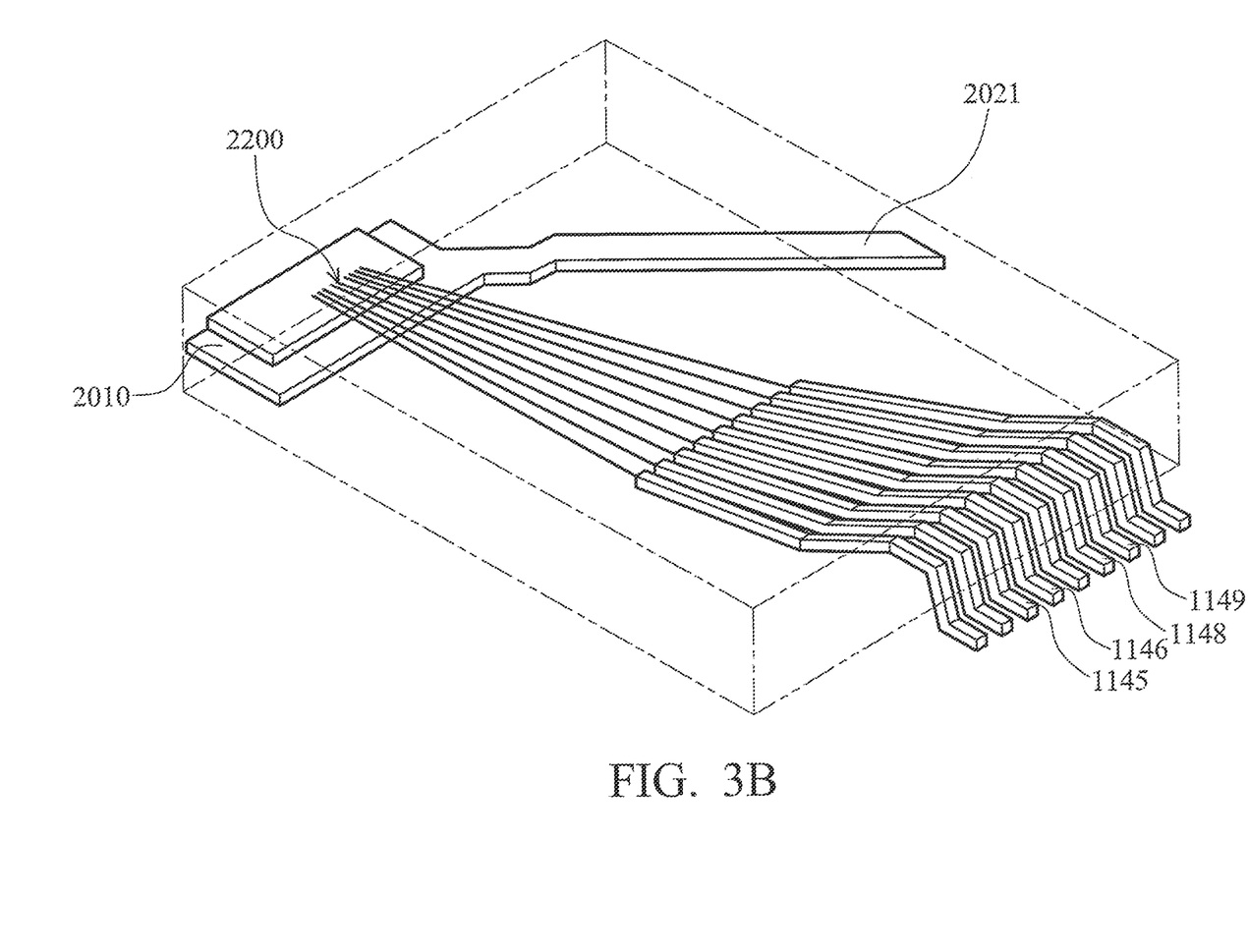

A magnified drawing of the shortened leads 1145, 1146, 1148, and 1149 is shown in FIG. 3B. For an electronic signal with a frequency of approximately 750 MHz, the differential impedance values of a differential pair of the leads 1145 and 1146 is near 84 ohm, which achieve the desired values. Similarly, the differential impedance value of a differential pair of the leads 1148 and 1149 is near 84 ohm, which achieves the desired values, too. And the single-ended impedance values thereof are near 58 ohm. It is appreciated that the package of the first experimental example utilizes the leadframe structure of the invention to cause the impedance values of the predetermined leads fulfilling the desired values for impedance match.

Figure 4A:
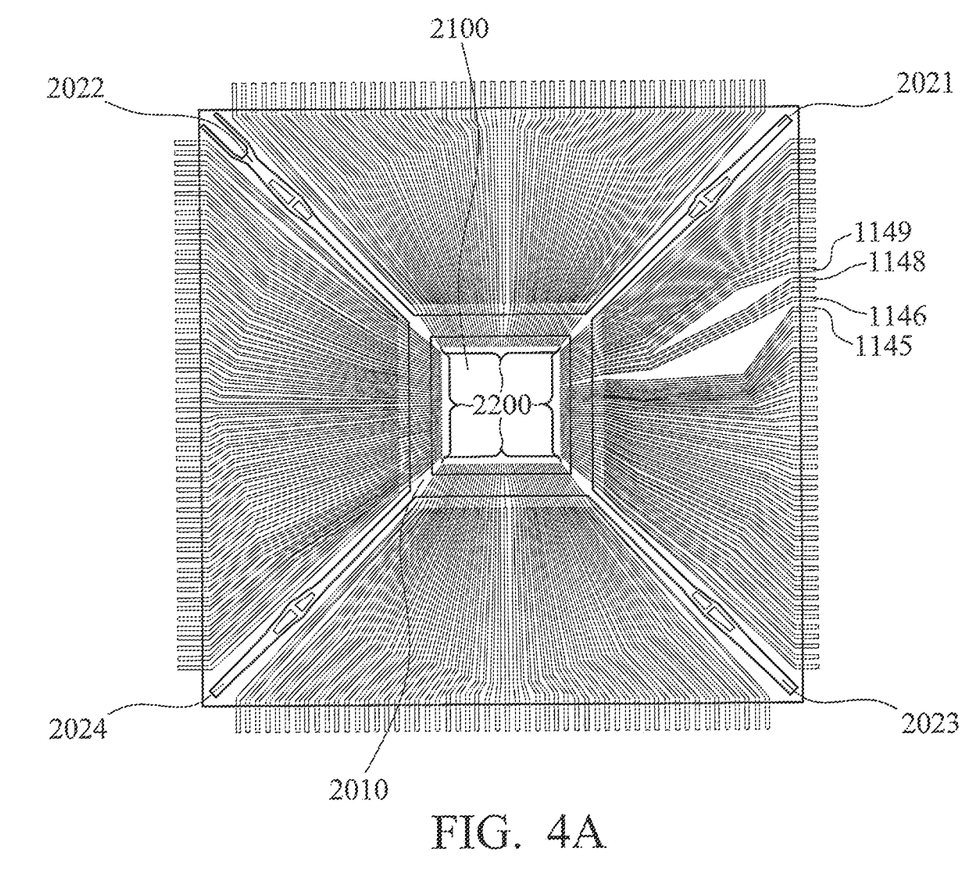
FIGS. 4A and 4B illustrate a second experimental example of the invention.

In FIG. 4A, a top view of a semiconductor package of a second experimental example of the invention is shown. Compared to that shown in FIG. 3A, spaces between the leads 1145 and 1146, and the space between the leads 1148 and 1149 are broader. Thus, the leadframe utilized in the package shown in FIG. 4A can act as another embodiment of the invention.

Figure 4B:
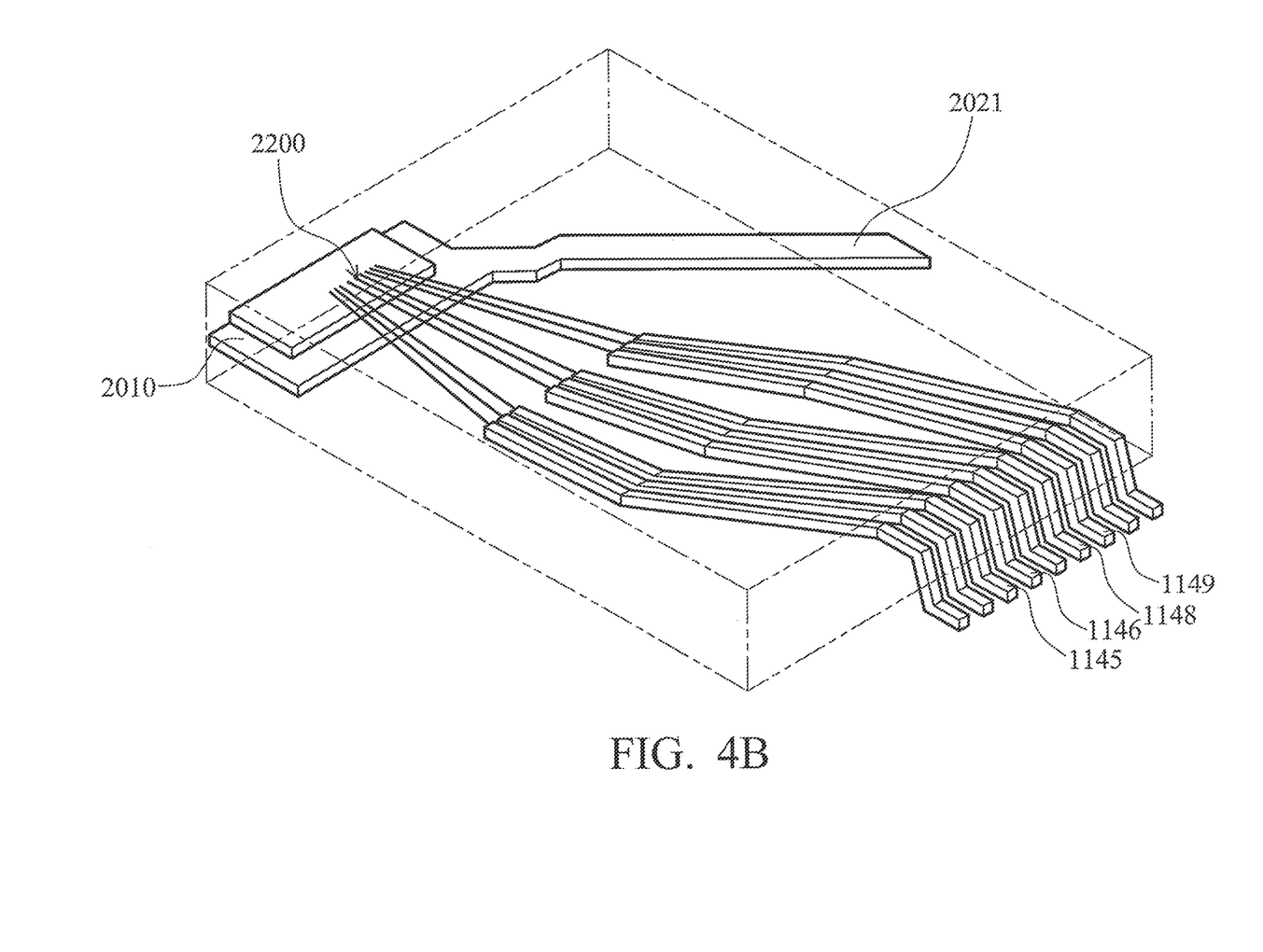

A magnified drawing of the leads 1145, 1146, 1148, and 1149 of FIG. 4A is shown in FIG. 4B. For an electronic signal with a frequency of approximately 750 MHz, the differential impedance values of a differential pair of the leads 1145 and 1146 is near 108 ohm, which achieve the desired values. Similarly, the differential impedance value of a differential pair of the leads 1148 and 1149 is near 108 ohm, which achieves the desired values, too. And the single-ended impedance values thereof are near 62 ohm. It is appreciated that the package of the second experimental example utilizes the leadframe structure of the invention to cause the impedance values of the predetermined leads fulfilling the desired values for impedance match.

The efficacy of the inventive leadframes at developing asymmetrical lead route or lead distribution provides effective impedance match for the resulting products.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A leadframe for semiconductor packages, comprising:
   a die pad;
   a side rail around the die pad;
   a tie bar connecting the die pad and the side rail; and
   a plurality of leads extending from the side rail in close proximity to the die pad, comprising a first lead with no branch and a second lead being at opposite locations of the leadframe relative to a center line through the die pad, wherein the first and second leads are substantially asymmetrical with each other relative to the center line and have different impedance values, wherein the plurality of leads are spaced apart from each other, and the plurality of leads further comprise a third lead adjacent to the first lead, and fourth lead adjacent to the second lead,
   wherein the plurality of leads are directly and electrically connected to a chip attached on the die pad through a plurality of bonding wires, and each of the first and second leads is connected to a different one of the plurality of bonding wires,
   wherein a pitch between the first and third leads is different from a pitch between the second and fourth leads.

2. The leadframe as claimed in claim 1, wherein the first and second leads comprise substantially different lead lengths.

3. The leadframe as claimed in claim 1, wherein the first and second leads comprise substantially different lead widths.

4. The leadframe as claimed in claim 1, wherein the first and second leads comprise substantially asymmetrical extending traces.

5. The leadframe as claimed in claim 1, wherein a space between the first and third leads is substantially different from that between the second and fourth leads.

6. The leadframe as claimed in claim 5, wherein the space between the first and third leads is not uniform.

7. The leadframe as claimed in claim 6, wherein at least one section of the space between the first and third leads increases and then decreases.

8. The leadframe as claimed in claim 1, wherein the third lead and the fourth lead are at opposite locations of the leadframe relative to the center line.

9. A method of achieving a desired impedance value for a leadframe for semiconductor packages, comprising:
   providing a leadframe comprising a die pad, a side rail around the die pad, a tie bar connecting the die pad and the side rail, and a plurality of leads extending from the side rail in close proximity to the die pad; designing a layout of the plurality of leads comprising a first lead with no branch and a second lead being at opposite locations of the leadframe relative to a center line through the die pad, wherein the first and second leads are substantially asymmetrical with each other relative to the center line and have different impedance values, wherein the plurality of leads are spaced apart from each other, and the plurality of leads further comprise a third lead adjacent to the first lead, and a fourth lead adjacent to the second lead; and
   providing a plurality of bonding wires for directly and electrically connecting a chip attached on the die pad and the plurality of leads, wherein each of the first and second leads is connected to a different one of the plurality of bonding wires,
   wherein a pitch between the first and third leads is different from a pitch between the second and fourth leads.

10. The method as claimed in claim 9, wherein the first and second leads comprise substantially different lead lengths.

11. The method as claimed in claim 9, wherein the first and second leads comprise substantially different lead widths.

12. The method as claimed in claim 9, wherein the first and second leads comprise substantially asymmetrical extending traces.

13. The method as claimed in claim 9, wherein a space between the first and third leads is substantially different from that between the second and fourth leads.

14. The method as claimed in claim 13, wherein the space between the first and third leads is not uniform.

15. The method as claimed in claim 14, wherein at least one section of the space between the first and third leads increases and then decreases.

16. The method as claimed in claim 9, wherein the third lead and the fourth lead are at opposite locations of the leadframe relative to the center line.

* * * * *